(12) United States Patent
Fukuda

(10) Patent No.: US 7,514,747 B2
(45) Date of Patent: Apr. 7, 2009

(54) SILICON-ON-INSULATOR SEMICONDUCTOR DEVICE

(75) Inventor: Koichi Fukuda, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 73 days.

(21) Appl. No.: 11/798,988

(22) Filed: May 18, 2007

(65) Prior Publication Data

US 2008/0012075 A1     Jan. 17, 2008

(30) Foreign Application Priority Data

Jul. 13, 2006   (JP)   ............................. 2006-193120

(51) Int. Cl.
*H01L 23/62* (2006.01)
(52) U.S. Cl. ............... 257/347; 257/213; 257/E29.266; 257/E29.268
(58) Field of Classification Search .................. 257/347, 257/E27.114
See application file for complete search history.

(56) References Cited

FOREIGN PATENT DOCUMENTS

| JP | 04-313242 | 11/1992 |
|---|---|---|
| JP | 10-012883 | 1/1998 |
| JP | 2000-269503 | 9/2000 |

*Primary Examiner*—Sue A Purvis
*Assistant Examiner*—Tucker Wright
(74) *Attorney, Agent, or Firm*—Rabin & Berdo, PC

(57) ABSTRACT

A semiconductor device formed in a silicon-on-insulator substrate includes a silicon channel region located between silicon source and drain regions, and a low-carrier-concentration layer that underlies the channel region. The low-carrier-concentration layer makes contact with both the channel region and the source region. The channel region and the low-carrier-concentration layer are of the same conductive type, but the low-carrier-concentration layer is doped to have a lower carrier concentration than the channel region. The low-carrier-concentration layer eliminates the floating substrate effect, because carriers that would otherwise accumulate in the channel region can escape through the low-carrier-concentration layer into the source region.

17 Claims, 6 Drawing Sheets

SILICON-ON-INSULATOR SEMICONDUCTOR DEVICE

BACKGROUND OF THE INVENTION

1. Field of the Invention

The present invention relates to a semiconductor device formed on a silicon-on-insulator (SOI) substrate.

2. Description of the Related Art

Metal-insulator-semiconductor field effect transistors (MISFETs), typically metal-oxide-semiconductor field effect transistors (MOSFETs) such as p-channel MOSFETs (pMOS devices) and n-channel MOSFETs (nMOS devices), derive several advantages from being formed on an SOI substrate instead of a bulk silicon substrate. One advantage is that there are no pn junctions at the bottoms of the source and drain regions of the transistors, so the transistors have less parasitic capacitance and operate faster. Another advantage is that mutually adjacent devices are completely isolated from each other, so no parasitic elements are formed and malfunctions such as latch-up do not occur.

The devices formed on an SOI substrate are classified as partially depleted or fully depleted. Both types include a semiconductor layer formed on an insulating layer, but a fully depleted device has a thinner semiconductor layer, so that when turned on, it becomes substantially free of carriers of one type (holes, for an nMOS device). Fully depleted SOI devices are particularly fast because, as there is no depletion layer capacitance, a channel forms quickly when a voltage is applied to the gate (the device has a sharp sub-threshold characteristic). The thinness of the semiconductor layer and the presence of the insulating layer also suppress short-channel effects.

SOI devices are not without problems, however. Since the body of each device is electrically isolated, excess carriers of the depleted type (holes, in an nMOS device) generated by impact ionization in the drain vicinity cannot escape from the channel region. This so-called substrate floating effect lowers the threshold voltage of the device and reduces its source-drain breakdown voltage. In analog circuits the substrate floating effect is particularly problematic because it kinks the voltage-current operating characteristic of the device and produces large changes in current in response to certain small voltage changes. Suppressing the substrate floating effect is a key issue in devices that must withstand high source-drain voltages or operate with linear characteristics.

A known method of suppressing the substrate floating effect is to implant germanium into the highly doped source and drain areas exterior to the gate sidewalls. Germanium has a narrower band gap than silicon, so the presence of germanium in the source region lowers the source-channel potential barrier, enabling excess electrons (in a pMOS device) or holes (in an nMOS device) that accumulate in the channel region to escape from the device through its source electrode. Japanese Patent Application Publication (JP) No. 10-12883 describes a pMOS device of this type (e.g., in paragraphs 0019-0023 and FIGS. 1 and 2). JP 4-313242 describes an nMOS device of this type (e.g., in paragraphs 0008-0011 and FIG. 1).

Fabrication of devices of this type, however, requires an additional germanium ion implantation process, which makes it necessary to install costly additional fabrication equipment and modify the layout of the fabrication line. A further problem is that the formation of a silicon-germanium drain layer lowers the potential barrier on the drain side as well as the source side, leading to increased leakage of current between the source and drain.

Another way to suppress the substrate floating effect is to replace part of the pn junction between the source and channel regions with a Schottky junction. As described in JP 2000-269503 (e.g., in paragraphs 0023-0031 and FIGS. 1 and 3), this is done by forming a mesa of photoresist on part of the isolation region that surrounds the device, and then forming the highly doped source and drain regions by slanted implantation of an impurity from four directions, followed by metal silicide formation. A small part of the source region, shadowed by the resist mask and the gate electrode during three of the four implantations, is shallower than the silicidation depth and is replaced entirely with silicide material, creating a Schottky junction through which excess carriers can escape.

A problem with this method is that the width of the pn junction between the source and channel regions is reduced, so the device must be widened in order to obtain an adequate current driving capability. Another problem is that the Schottky junction is formed at only one end of the device and cannot provide adequate removal of accumulated carriers from the entire channel region if the device is very wide. Providing Schottky junctions at fixed intervals along the width of the device would pose difficult fabrication problems and would greatly increase the size of the device.

It would be desirable to have a way to suppress the substrate floating effect without requiring enlargement of the device or implantation of germanium.

SUMMARY OF THE INVENTION

An object of the present invention is to suppress the substrate floating effect in an SOI device without altering the structure or doping of its source region or increasing the size of the device.

The invention provides a semiconductor device formed in an SOI substrate including a semiconductor layer of a first conductive type. The SOI substrate also includes an insulating layer such as a buried oxide layer disposed just below the semiconductor layer, a gate electrode, a gate insulation film sandwiched between the gate electrode and the semiconductor layer, and source and drains region of a second conductive type, opposite to the first conductive type, disposed in the semiconductor layer on mutually opposite sides of the gate electrode.

The semiconductor layer also includes a channel region of the first conductive type disposed below the gate electrode, and a low-carrier-concentration layer of the first conductive type disposed below the channel region, in contact with channel region and the source region. The low-carrier-concentration layer has a lower carrier concentration than the channel region.

The reduced carrier concentration in the low-carrier-concentration layer reduces the potential barrier at the pn junction between the low-carrier-concentration layer and the source region, so that excess carriers of the first conductive type that accumulate in the channel region can escape through the low-carrier-concentration layer into the source region. The floating substrate effect is thereby suppressed without the need to alter the structure or doping of the source region or increase the size of the device.

DETAILED DESCRIPTION OF THE INVENTION

Figure 1:
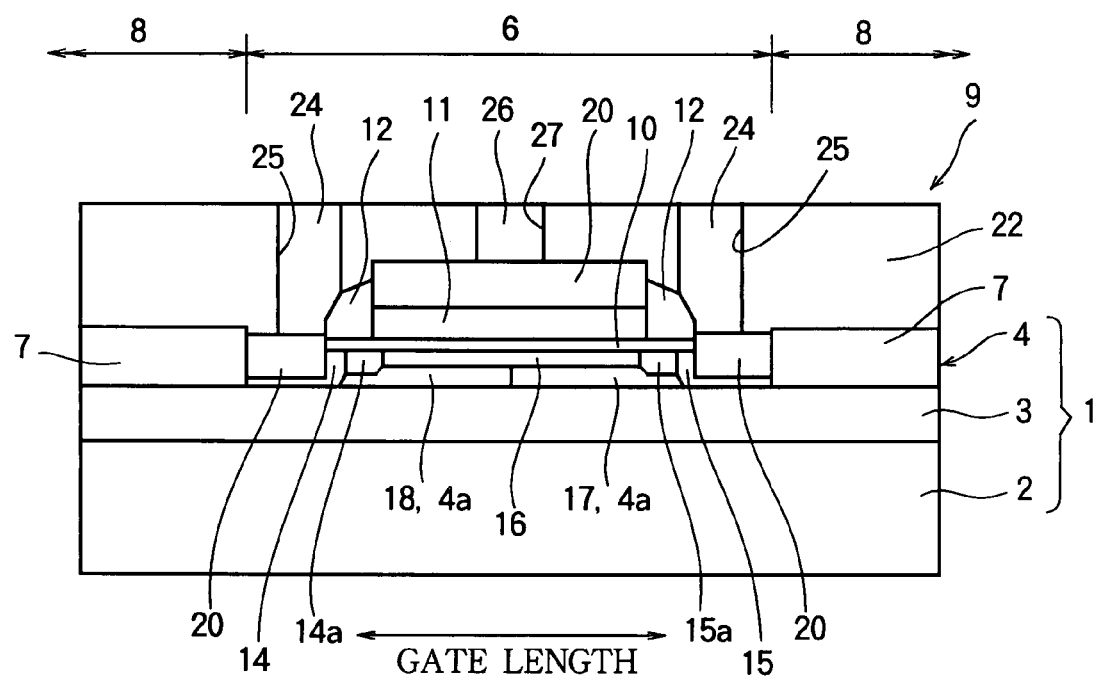
FIG. 1 is a sectional view of a transistor illustrating a first embodiment of the invention.

Embodiments of the invention will now be described with reference to the attached drawings, in which like elements are indicated by like reference characters.

First Embodiment

Referring to FIG. 1, the first embodiment is a MISFET formed in an SOI substrate 1 including a silicon supporting layer 2, a buried oxide layer 3, and a semiconductor layer referred to below as an SOI layer 4. The buried oxide layer 3, which is the insulating layer, is a layer of silicon dioxide ($SiO_2$) sandwiched between the silicon supporting layer 2 and the SOI layer 4. The SOI layer 4 is a thin layer of crystalline silicon.

The MISFET is formed in a circuit element region 6 surrounded by isolating material 7 in an isolation region 8. The isolating material 7 is a dielectric material such as silicon dioxide and extends down to the buried oxide layer 3, so that adjacent circuit element regions 6 are electrically isolated from each other.

The MISFET formed in the circuit element region 6 in the drawing is a fully depleted nMOS device 9.

The MISFET includes a gate insulation film 10, which is a comparatively thin layer of dielectric material such as silicon dioxide. A gate electrode 11 with sidewalls 12 is disposed on the gate insulation film 10. The gate electrode 11 is a strip of polycrystalline silicon (polysilicon) running across the center of the circuit element region 6 and doped with an impurity of the same conductive type (the n-type, in the present embodiment) as the source and drain regions described below. The sidewalls 12 are layers of a dielectric material such as silicon nitride ($Si_3N_4$) deposited on opposite sides of the gate electrode 11, mutually separated by the length of the gate electrode 11 and separated from the SOI layer 4 by the gate insulation film 10.

The length of the gate electrode 11 extends in the left-right direction in the drawing. The width of the gate electrode 11 extends into the drawing sheet. In general, the gate width exceeds the gate length.

The source region 14 and drain region 15 are parts of the SOI layer 4 disposed on opposite sides of the gate electrode 11, doped at a comparatively high carrier concentration with an n-type impurity such as phosphorus (P) or arsenic (As), extending down to the buried oxide layer 3 and terminating under the sidewalls 12. Thin extensions 14a, 14b of the source and drain regions 14, 15, doped with the same type of impurity but at a lower concentration, reach farther inward, terminating below the outer edges of the gate electrode 11, but do not extend as far down as the buried oxide layer 3. The extensions 14a, 15a mitigate hot electron effects.

The upper part of the SOI layer 4 between the source and drain extensions 14a, 15a is a channel region 16 doped with an impurity of the conductive type opposite to the source, gate, and drain type. In the present embodiment, this impurity is a p-type impurity such as boron (B). During operation of the device, a population inversion layer and depletion layer form in the channel region 16.

In the lower part 4a of the SOI layer 4, a pocket layer 17 extends in the gate length direction from about the midline of the device beneath the channel region 16 to the drain extension 15a, and continues under the drain extension 15a to the edge of the highly-doped drain region 15. The pocket layer 17 is doped with the same type of impurity (p-type, in this embodiment) as the channel region 16 but at a higher carrier concentration. One purpose of the pocket layer 17 is to prevent short-channel effects.

The remaining part 18 of the SOI layer extends from the edge of the pocket layer beneath the channel region 16, toward the source extension 14a, and continues beneath the source extension 14a to the edge of the highly-doped source region 14. The remaining SOI layer 18, which retains the original doping of the SOI layer 4, conducts holes from the channel region 16 into the source extension 14a.

The original doping of the SOI layer 4, provided by ion implantation before the source, gate, and drain structures are formed, is a low-concentration doping with a p-type impurity. The carrier concentration in the original SOI layer 4, and thus in the remaining SOI layer 18, is about $1 \times 10^{14}/cm^3$. The carrier concentrations in the other regions are $1 \times 10^{19}/cm^3$ to $1 \times 10^{21}/cm^3$ in the n-type source and drain regions, $1 \times 10^{17}/cm^3$ to $2 \times 10^{20}/cm^3$ in their n-type extensions, at least $1 \times 10^{17}/cm^3$ but not more than $5 \times 10^{18}/cm^3$ in the p-type channel region, and at least $1 \times 10^{18}/cm^3$ in the p-type pocket layer.

To provide enhanced electrical conductivity, the gate electrode 11, source region 14, and drain region 15 are covered by silicide layers 20 comprising a compound of silicon and a metal such as cobalt (Co) or titanium (Ti). The device 9 as a whole is covered by an interlayer dielectric film 22 such as a film of nondoped silica glass (NSG) or silicon dioxide. Contact plugs 24 of a conductive material such as tungsten (W) or aluminum (Al) extend from the surface of the interlayer dielectric film 22 through holes 25 in the interlayer dielectric film 22 to the silicide layers 20 on the source and drain regions. Another conductive contact plug 26 extends through another hole 27 in the interlayer dielectric film 22 to the silicide layer 20 on the gate electrode 11. These contact plugs 24, 26 electrically connect the source region 14, drain region 15, and gate electrode 11 to metal wiring (not shown) on the surface of the interlayer dielectric film 22.

A method of fabricating the semiconductor device in FIG. 1 will now be described with reference to FIGS. 2 to 13.

Figure 2:
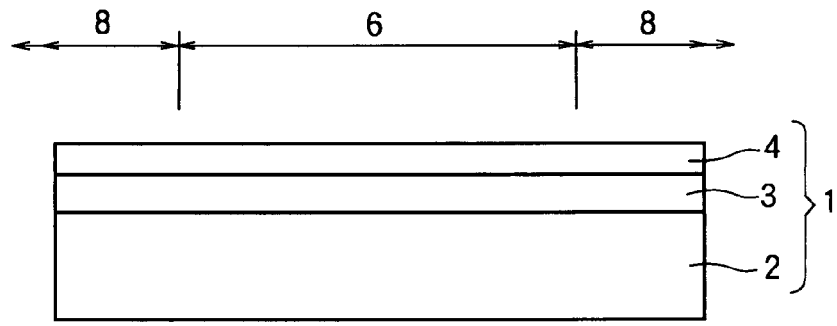
FIGS. 2, 3, 4, 5, 6, and 7 are sectional views illustrating initial steps in the fabrication of the first embodiment and a second embodiment.
Figure 3:
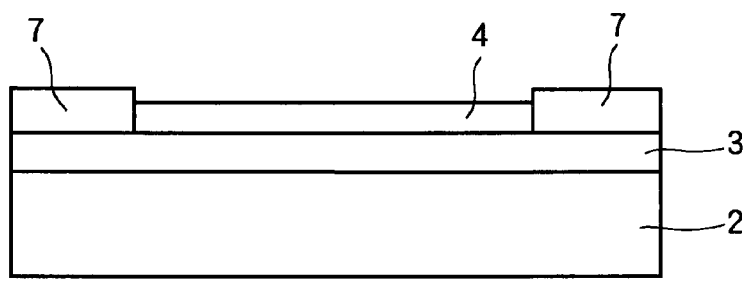

Referring to FIG. 2, in a process known as separation by implanted oxygen (SIMOX), oxygen is implanted in a silicon substrate doped at a low concentration with a p-type impurity, and the silicon substrate is annealed to form the buried oxide layer 3, leaving a thin layer of crystalline silicon above the buried oxide layer 3 and a thick silicon supporting layer 2 below the buried oxide layer 3.

Next, the upper surface is thermally oxidized to form a sacrificial layer, and the sacrificial layer is removed by wet etching to leave a p-type semiconductor layer or SOI layer 4 above the buried oxide layer 3. The purpose of forming and removing the sacrificial oxide layer is to adjust the thickness of the SOI layer 4. Part of the SOI layer 4 is the circuit element region 6, and the surrounding part is the isolation region 8.

The surface of the SOI layer 4 is now thermally oxidized again to form a thin pad oxide film (not shown). A silicon nitride film (not shown) is deposited on the pad oxide film by chemical vapor deposition (CVD) and patterned by photolithography to form a mask defining the circuit element region 6.

Photolithography is a well-known process in which the entire device is coated with a layer of positive or negative photoresist, and the photoresist is exposed to light through an optical mask, then developed to form a resist mask reproducing the pattern of the optical mask. This process may be followed by an etching process to remove material not covered by the resist mask. In the present case, the uncovered material is the part of the silicon nitride film disposed in the isolation region 8, and this material is removed by anisotropic etching to expose the pad oxide film.

After the resist mask has been removed, the isolation region 8 is oxidized by a process known as local oxidation of silicon (LOCOS). The silicon nitride mask is then removed by wet etching to leave the state shown in FIG. 3.

Figure 4:
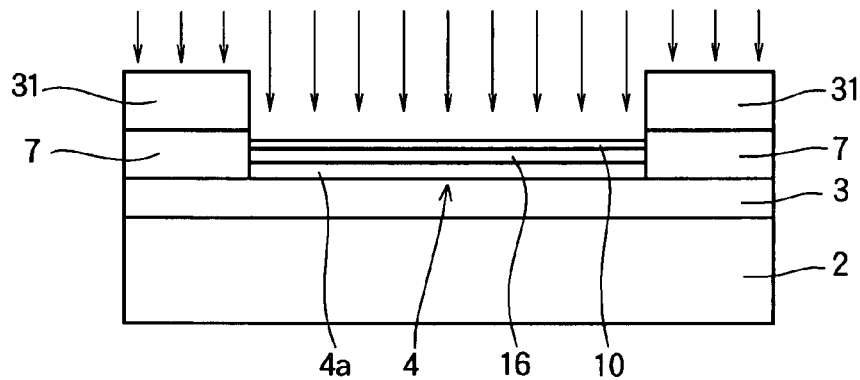

Referring to FIG. 4, the surface of the circuit element region 6 in the SOI layer 4 is thermally oxidized to form the gate insulation film 10. Another resist mask 31 is then formed by photolithography, covering the isolation region 8 and exposing the gate insulation film 10 in the circuit element region 6. Ions of a p-type impurity are implanted through the gate insulation film 10 to a shallow depth in the SOI layer 4 to form the channel region 16. The purpose of this ion implantation is to control the threshold voltage of the device. At this stage the channel region 16 occupies the entire upper part of the SOI layer 4. The implanted ions do not penetrate into the lower part 4a of the SOI layer 4, which is intentionally left in its original state.

Figure 5:
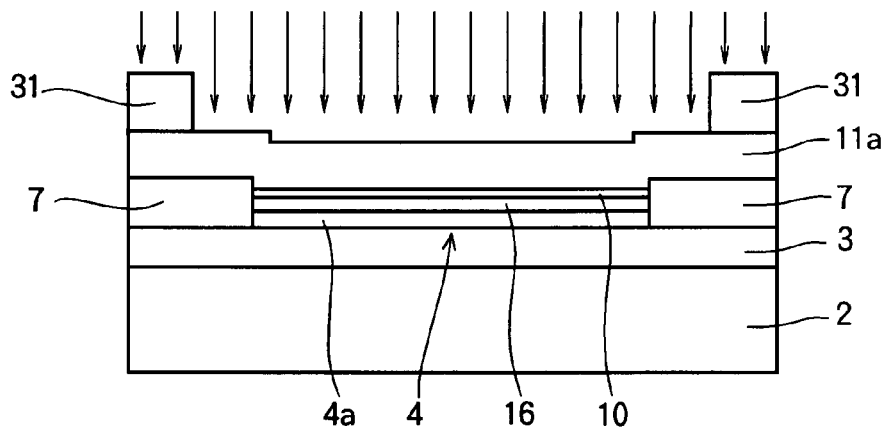

Referring to FIG. 5, the resist mask 31 used in FIG. 4 is removed and a layer of polysilicon is deposited on the gate insulation film 10 and isolating material 7 by CVD. This polysilicon layer 11a, which will become the gate electrode, is comparatively thick.

Another resist mask 31 is now formed by photolithography, exposing the polysilicon layer 11a in the circuit element region 6 and part of the surrounding area, and ions of an n-type impurity are implanted at a comparatively high concentration into the exposed polysilicon layer 11a.

Figure 6:
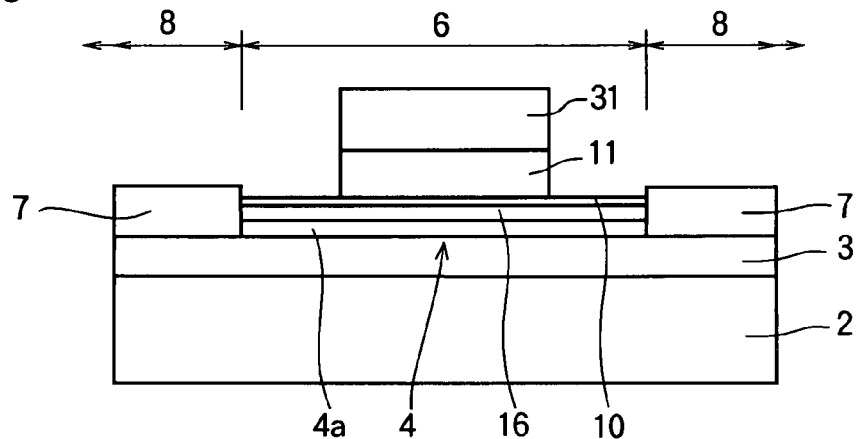

Referring to FIG. 6, the resist mask 31 used in FIG. 5 is removed and another resist mask 31 is formed by photolithography, covering the part of the polysilicon layer 11a that will become gate electrode. This part has the shape of a stripe running through the center of the circuit element region 6, extending completely across the circuit element region 6 in the gate width direction. An etching process, e.g., a dry etching process, is then used to remove the part of the polysilicon layer 11a not covered by the resist mask 31, leaving the gate electrode 11, which is separated from the channel region 16 by the gate insulation film 10.

Figure 7:
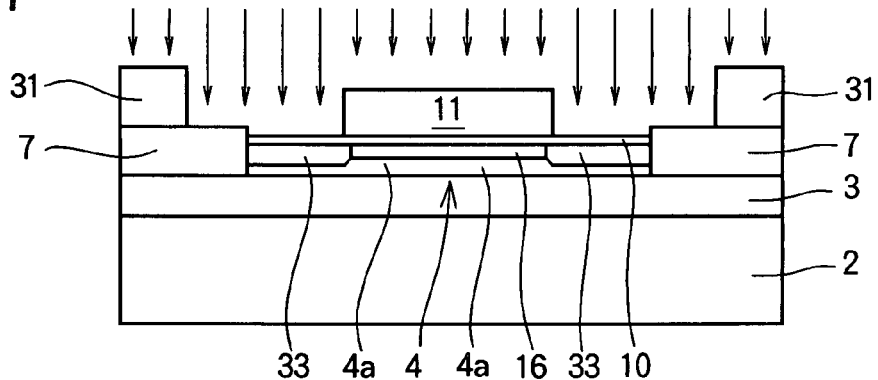

Referring to FIG. 7, the resist mask 31 used in FIG. 6 is removed, and yet another resist mask 31 is formed by photolithography, exposing the circuit element region 6 and part of the surrounding isolating material 7. Ions of an n-type impurity are then implanted at a comparatively low concentration through the gate insulation film 10 into the SOI layer 4 to form the extensions 33 of the source and drain areas. This ion implantation is masked by both the resist mask 31 and the gate electrode 11, so that the channel region 16 below the gate electrode 11 is left as a p-type region. The implantation depth is less than the depth of the buried oxide layer 3, but equal to or (preferably) greater than the depth of the channel region 16, so that the area immediately below the extensions 33 is free of channel material. Due to a slight lateral diffusion of the implanted ions, the edges of the extensions 33 lie slightly inside the edges of the gate electrode 11.

Figure 8:
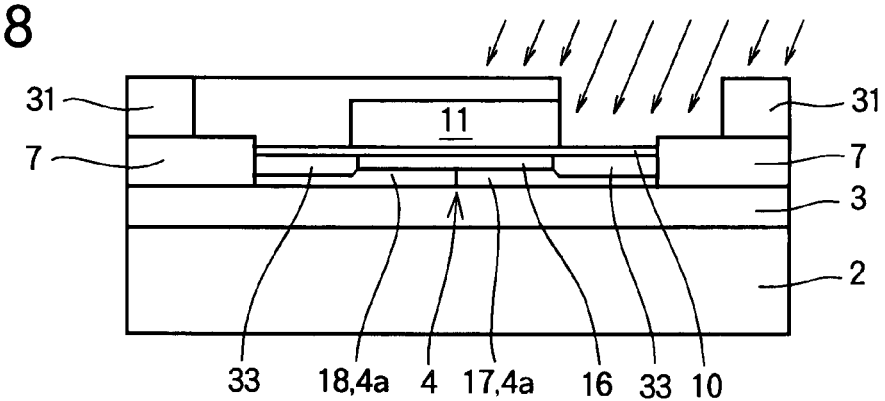
FIGS. 8, 9, and 10 are sectional views illustrating intermediate steps in the fabrication of the first embodiment.

Referring to FIG. 8, the resist mask 31 that was used in FIG. 7 is removed and another resist mask 31 is formed by photolithography, covering all of the device except for the space between the gate electrode 11 and the isolation region 8 on one side of the gate electrode 11, and part of the isolating material 7 in that isolation region. The uncovered area includes what will become the drain region of the device. Ions of a p-type impurity are implanted through the exposed part of the gate insulation film 10 into the underlying SOI layer 4 at an angle slanting downward from the isolating material 7 toward the gate electrode 11. The implantation depth and concentration are selected so that the ions are implanted into the lower part 4a of the SOI layer 4 between the extension 33 on the drain side and the buried oxide layer 3, and between part of the channel region 16 and the buried oxide layer 3, forming a pocket layer 17 with a higher carrier concentration than in the channel region 16. The implanted ions diffuse laterally to a point below about the midline of the gate electrode 11. Beyond the midline, the remaining SOI layer 18 occupies the space between the channel region 16 and the buried oxide layer 3, and between the source extension 33 and the buried oxide layer 3. The resist mask 31 is positioned so that it does not shadow the interface between the SOI layer 4 and the isolating material 7 on the drain side during this ion implantation process.

The resist mask 31 used in FIG. 8 is now removed and a silicon nitride film is deposited by CVD on the entire device, including in particular the gate electrode 11 and the exposed part of the gate insulation film 10. Another mask is then formed and the silicon nitride film is etched by an anisotropic etching process to leave only the part directly adjacent to the gate electrode 11, forming the sidewalls 12 shown in FIG. 9. This anisotropic etch also removes the part of the gate insulation film 10 that is not covered by the gate electrode 11 and its sidewalls 12, exposing the surfaces of parts of the extensions 33 in the SOI layer 4.

Figure 10:
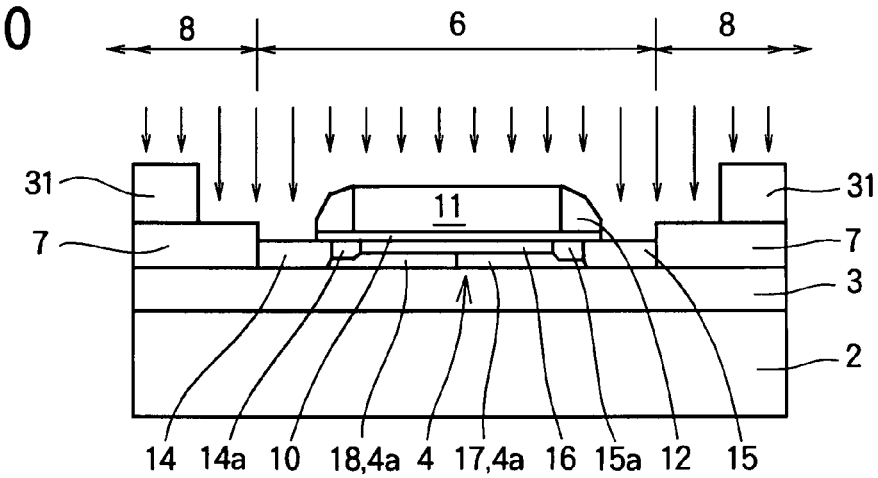

Referring to FIG. 10, a new resist mask 31 is formed by photolithography, exposing the circuit element region 6 and the surrounding part of the isolating material 7, and ions of an n-type impurity are implanted at a high concentration into the exposed parts of the SOI layer 4, that is, the parts not covered by the gate electrode 11 and its sidewalls 12. A rapid thermal anneal (RTA) is then carried out to activate the implanted ions, forming the source region 14 and drain region 15.

The source region 14 and drain region 15 have a comparatively high carrier concentration from the surface of the SOI layer 4 all the way down to the buried oxide layer 3. Due to lateral diffusion of the implanted impurity, the source and drain regions 14, 15 also extend partway under the sidewalls 12 of the gate electrode 11. The source region 14 and drain region 15 include parts of the SOI layer 4 that received p-type impurity ions in previous steps (parts of the pocket layer 17 and remaining SOI layer 18), or received n-type impurity ions at a lower carrier concentration (parts of the extensions 33); these parts are converted to n-type areas with a high carrier concentration, like the rest of the source region 14 and drain region 15. The remaining parts of the extensions become the source extension 14a and drain extension 15a. The remaining pocket layer 17 is left in contact with the channel region 16, the drain extension 15a, and part of the drain region 15. The remaining SOI layer 18 is left in contact with the channel region 16, the source extension 14a, and part of the source region 14.

Figure 11:
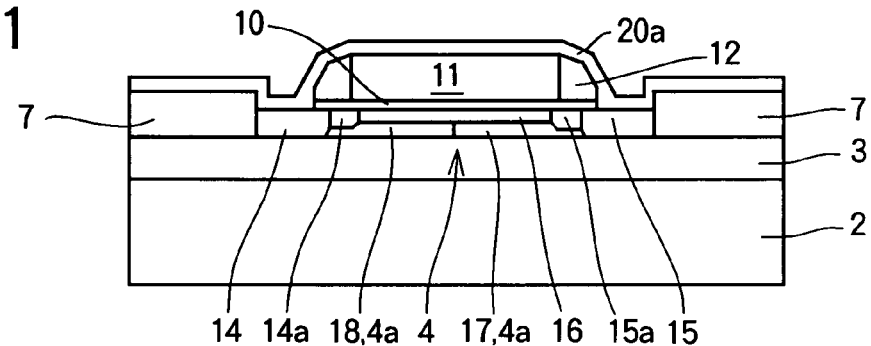
FIGS. 11, 12, and 13 are sectional views illustrating final steps in the fabrication of the first and second embodiments.

The resist mask 31 used in FIG. 10 is now removed and a layer of cobalt is deposited on the entire device by CVD or sputtering to form a siliciding source layer 20a as shown in FIG. 11. In particular, the siliciding source layer 20a covers the gate electrode 11, source region 14, and drain region 15.

Figure 12:
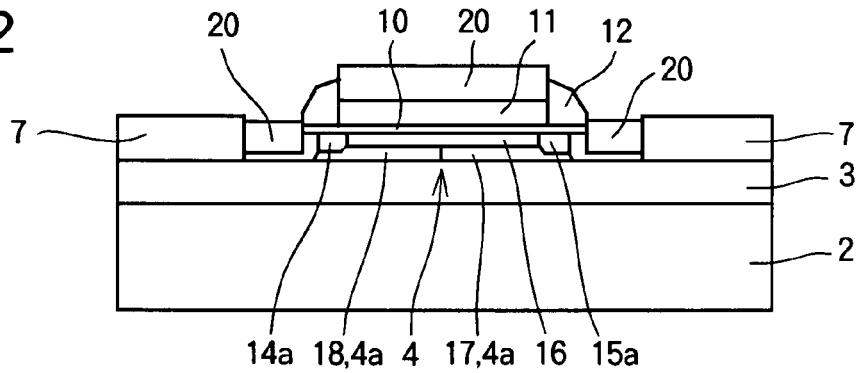

Referring to FIG. 12, a siliciding process is carried out to form silicide layers 20 on the gate electrode 11, source region 14, and drain region 15. The siliciding process includes an annealing step that causes the cobalt to react with the polysilicon in the upper part of the gate electrode 11 and the crystalline silicon in the upper part of the gate electrode 11 and source region 14, followed by removal of the unreacted cobalt material.

Figure 13:
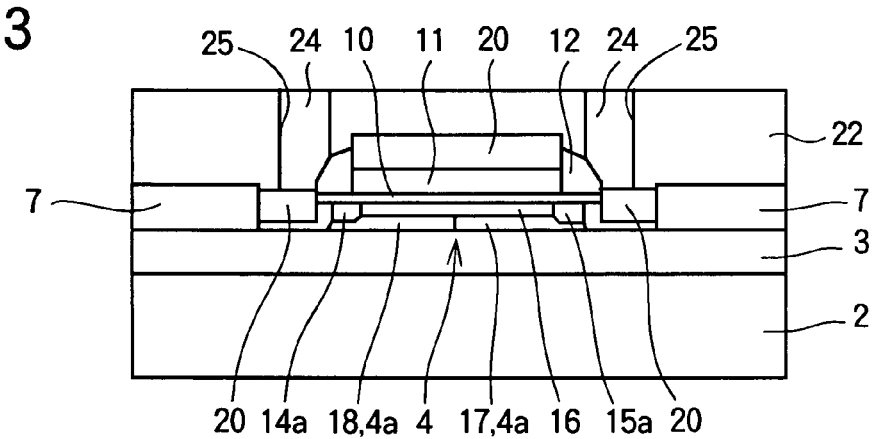

After the siliciding process, a comparatively thick layer of NSG is deposited on the entire device by CVD. The NSG layer is planarized to form the interlayer dielectric film 22 as shown in FIG. 13. A resist mask (not shown) with holes aimed at the source region 14 and drain region 15 and adjacent parts of the sidewalls 12 is then formed by photolithography, and an anisotropic etch is carried out to extend these holes through the interlayer dielectric film 22 until they reach the silicide layers 20 on the surfaces of the source region 14 and drain region 15, thereby forming the contact holes 25 shown in FIG. 13.

After the resist mask is removed, the contact plugs 24 are formed by using a CVD or sputtering process to fill the contact holes 25 with a conductive material. This process also deposits conductive material on the surface of the interlayer dielectric film 22, but the deposition process is followed by a planarizing process that re-exposes the surface of the interlayer dielectric film 22.

Next a similar process is used to form a contact hole 27 in the interlayer dielectric film 22 over the gate electrode 11 and fill it with a contact plug 26. A final planarization process completes the nMOS device 9 shown in FIG. 1.

Although a pn junction exists between the source extension 14a and the remaining SOI layer 18, since the carrier concentration in both the source extension 14a and the remaining SOI layer 18 is comparatively low, the potential barrier at this pn junction is comparatively small. Excess holes that accumulate in the p-type channel region 16 during operation of the device and migrate through the p-type remaining SOI layer 18 to the junction between the remaining SOI layer 18 and source extension 14a readily cross the low potential barrier at this junction and are drawn through the source extension 14a into the highly doped n-type source region 14. There the holes quickly recombine with electrons, becoming an electron current that escapes from the device through the source silicide layer 20 and contact plug 24. In this way the excess holes are removed from the device; that is, the substrate floating effect is suppressed.

As the pn junction between the source extension 14a and remaining SOI layer 18 extends for the entire width of the device, accumulated holes are removed adequately even from a very wide device.

As the pn junction between the channel region 16 and source extension 14a also extends for the entire width of the device, it is not necessary to enlarge the device in order to obtain an adequate current driving capability.

As the pocket layer 17 has a higher carrier concentration than the channel region 16 and remaining SOI layer 18, the potential barrier at the pn junction between the pocket layer 17 and the drain extension 15a is higher than the potential barrier at the pn junction between the channel region 16 and the drain extension 15a, and higher than the potential barrier would be at the pn junction between the remaining SOI layer 18 and the drain region 15 if the pocket layer 17 were not formed and the remaining SOI layer 18 were left in contact with the drain region 15. This relatively high potential barrier impedes the flow of drain-to-source leakage current.

In the nMOS device 9 of the present embodiment, accordingly, the substrate floating effect is suppressed without causing an increase in leakage current or reducing the source-drain breakdown voltage.

The nMOS device 9 of the present embodiment can be fabricated with ordinary p-type and n-type ion implantation equipment; it is not necessary to install special fabrication equipment to implant germanium ions, for example.

The nMOS device 9 of the present embodiment was fabricated from an SOI substrate 1 in which the carrier concentration in the SOI layer 4 was approximately $1 \times 10^{14}/cm^3$, so that the carrier concentration in the remaining SOI layer 18 is approximately $1 \times 10^{14}/cm^3$, but the invention is not limited a carrier concentration of this order. It is only necessary for the remaining SOI layer 18 to be a p-type layer with a carrier concentration greater than zero and less than $1 \times 10^{17}/cm^3$, so that the remaining SOI layer 18 is of the same conductive type as the channel region 16 but has a lower carrier concentration. The carrier concentration in the remaining SOI layer 18 is preferably selected so that the potential barrier at the pn junction between the source extension 14a and remaining SOI layer 18, if expressed as an energy barrier, is at least 0.6 eV (electron volt) but not greater than 0.9 eV. The potential barrier at this pn junction should also be sufficiently less than the potential barrier at the pn junction on the drain side (1.0 eV), so as to facilitate the escape of accumulated holes from the channel region 16 without permitting significant flow of source-drain leakage current.

The advantages of the above embodiment are that it suppresses the substrate floating effect without requiring a change in the planar device structure, or changes in the fabrication line used to manufacture it. Consequently, existing levels of integration can be maintained, as well as existing levels of source-drain leakage and breakdown performance and current-driving performance, and the substrate floating effect can be suppressed with relatively little additional fabrication cost.

Second Embodiment

Figure 14:
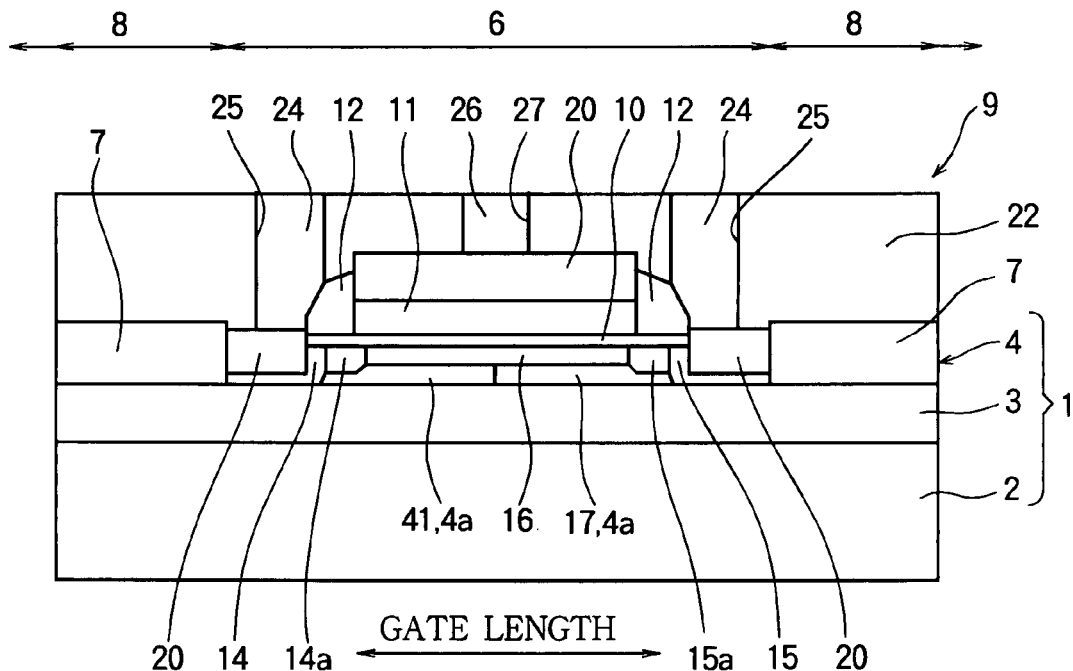
FIG. 14 is a sectional view of a transistor illustrating the second embodiment of the invention.

Referring to FIG. 14, the second embodiment is an nMOS device 9 with the same structure as in the first embodiment, except that the remaining SOI layer of the first embodiment is replaced by a doubly doped layer 41. Descriptions of the other constituent elements in FIG. 14 will be omitted, as their functions and carrier concentrations are the same as in the first embodiment.

Like the remaining SOI layer in the first embodiment, the doubly doped layer 41 extends from about the midline of the gate electrode 11 beneath the channel region 16 toward the source extension 14a, continues beneath the source extension 14a, and makes contact with the source region 14, its extension 14a, and the channel region 16. The doubly doped layer 41 is first doped with a p-type impurity at the same relatively high carrier concentration as the pocket layer 17, and is then doped with an n-type impurity at a lower concentration such that while the doubly doped layer 41 remains a p-type region, its net carrier concentration is less than the carrier concentration in the channel region 16. Specifically, the carrier concentration in the doubly doped layer 41 is less than $1 \times 10^{17}/cm^3$.

A process for fabricating the semiconductor device in FIG. 1 will now be described with reference to FIGS. 2 to 7, 15 to 18, and 11 to 13. The initial steps, shown in FIGS. 2 to 7, are the same as in the first embodiment, so the description will start from the first intermediate step.

Figure 15:
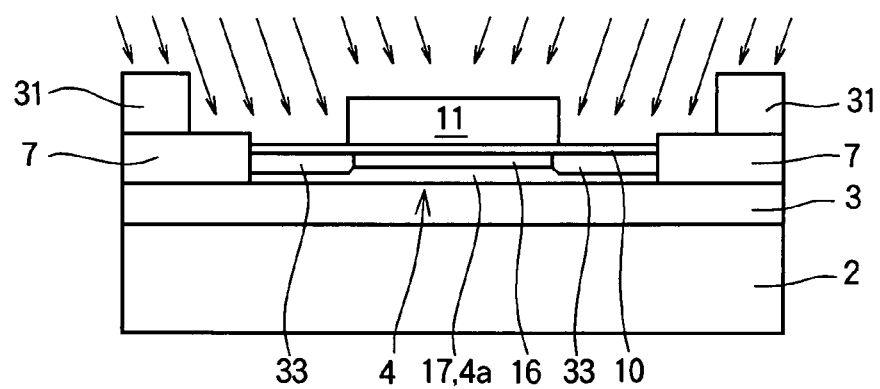
FIGS. 15, 16, 17, and 18 are sectional views illustrating intermediate steps in the fabrication of the second embodiment.

Following the n-type ion implantation that forms the extensions 33 in FIG. 7, the same resist mask 31 is used to implant p-type impurity ions through the gate insulation film 10 into the SOI layer 4 as shown in FIG. 15. The implantation angle is slanted downward from the resist mask 31 on both sides toward the gate electrode 11 in the center. The implantation energy and angle are selected so that the ions are implanted into the deeper parts of the SOI layer 4 and so that the interfaces between the SOI layer 4 and the isolating material 7 on the source and drain sides are not shadowed by the resist mask 31. This ion implantation raises the carrier concentration in the entire lower part 4a of the SOI layer 4 to a higher level than in the channel region 16, thereby forming a pocket layer 17 that, at this stage, occupies the entire lower part 4a of the SOI layer 4.

Figure 16:
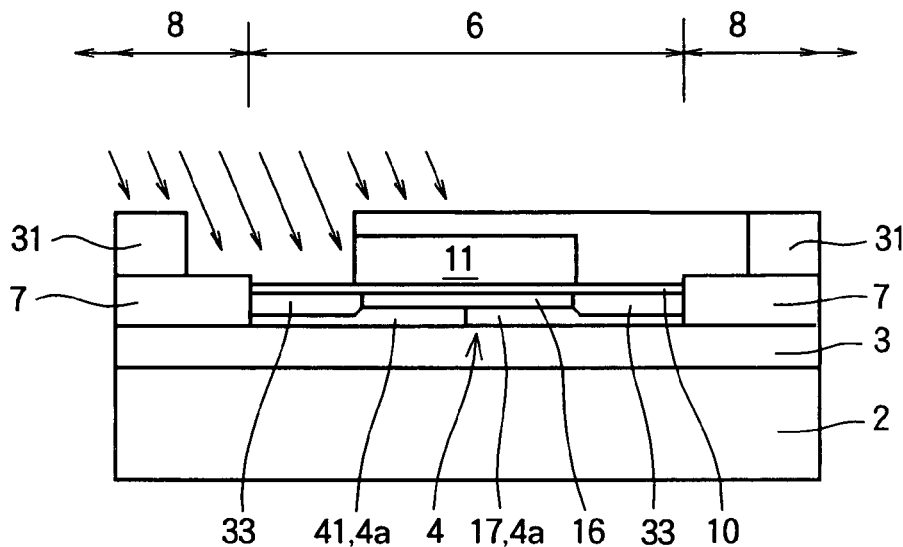

Referring to FIG. 16, the resist mask 31 that was used in FIG. 15 is removed and another resist mask 31 is formed by photolithography, covering all of the device except for the space between the gate electrode 11 and the isolation region 8 on the source side, and part of the isolating material 7 around that space. The uncovered area includes what will become the source region of the device. Ions of an n-type impurity are implanted at an angle slanting downward from the isolating material 7 toward the gate electrode 11 through the exposed part of the gate insulation film 10 into the underlying SOI layer 4. The implantation depth and concentration are selected so that the ions are implanted into the lower part 4a of the SOI layer 4 between the extension 33 on the source side and the buried oxide layer 3, and between part of the channel region 16 and the buried oxide layer 3, forming a doubly doped layer 41 with a net p-type conductivity and a lower carrier concentration than in the channel region 16. The implanted ions diffuse laterally to a point below about the midline of the gate electrode 11, reducing the pocket layer 17 to the region on the drain side of the midline. The resist mask 31 is positioned so that it does not shadow the interface between the SOI layer 4 and the isolating material 7 on the source side during this ion implantation process.

Figure 9:
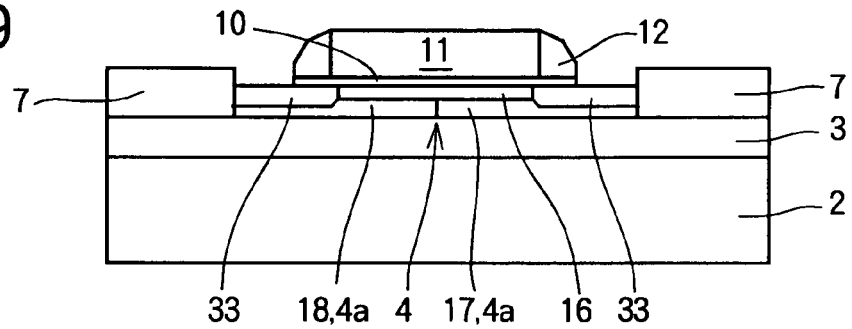
Figure 17:
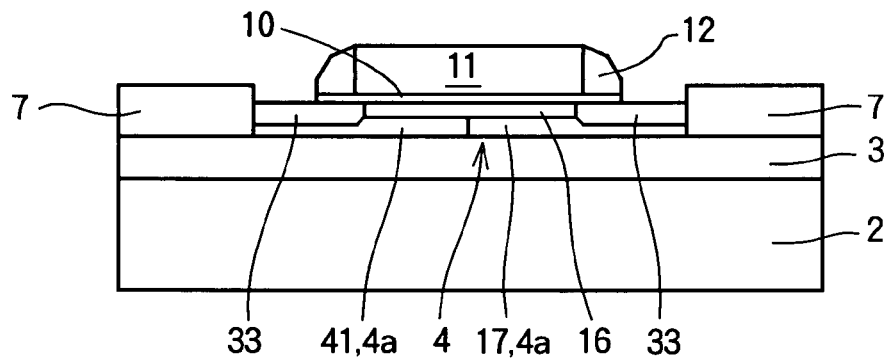

Referring to FIG. 17, the resist mask 31 that was used in FIG. 16 is removed, and sidewalls 12 are formed by the process described in the first embodiment (FIG. 9).

Figure 18:
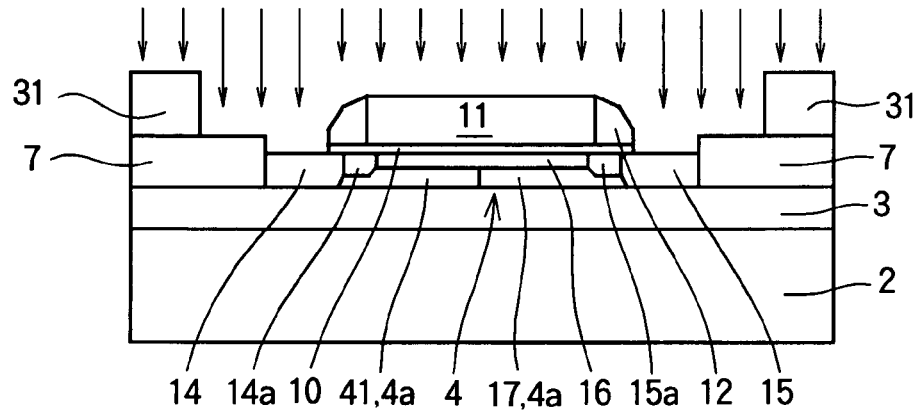

Referring to FIG. 18, a new resist mask 31 is formed by photolithography, and ions of an n-type impurity are implanted to form the source region 14 and drain region 15 as explained in the first embodiment (FIG. 10). The source region 14 includes part of what had been the doubly doped layer 41 in FIG. 17. The remaining part of the doubly doped layer 41 is left in contact with the source region 14, the source extension 14a, and the channel region 16.

The fabrication process then continues with the steps shown in FIGS. 11-13 in the first embodiment to form the silicide layers 20, interlayer dielectric film 22, contact holes 25, 27, and contact plugs 24, 26, completing the nMOS device 9 shown in FIG. 14.

The doubly doped layer 41 has the same function as the remaining SOI layer 18 in the first embodiment. The potential barrier at the pn junction between the source extension 14a and the doubly doped layer 41 is lower than the potential barrier at the pn junction between the channel region 16 and the source extension 14a. Excess holes that accumulate in the channel region 16 during operation of the device can migrate through the doubly doped layer 41 to the pn junction between the source extension 14a and the doubly doped layer 41, cross the relatively low potential barrier at this pn junction, and drift through the source extension 14a into the doubly doped layer 41. There they rapidly recombine with electrons and are thus converted into an electron current that leaves the device through the source silicide layer 20 and contact plug 24.

The second embodiment provides the same advantages as the first embodiment: the source extension 14a and doubly doped layer 41 both extend for the entire width of the device, so the device does not have to be enlarged to provide adequate current driving capability and excess holes can be removed efficiently from the channel region 16 even in a very wide device. Conventional fabrication equipment can be used, and existing source-drain leakage and breakdown performance can be maintained.

A further advantage of the second embodiment is that the carrier concentration in the doubly doped layer 41 can be adjusted to any desired level by appropriate selection of the amount of n-type impurity implanted into the doubly doped layer 41 in the fabrication step shown in FIG. 16.

The invention has been described in relation to an nMOS device, but can also be practiced in a pMOS device, by reversing the types of ions implanted in the ion implantation steps.

If the invention is practiced with a doubly doped layer as in the second embodiment, the SOI layer may initially be either a p-type or an n-type layer, or an intrinsic silicon layer.

The invention can also be practiced in other types of silicon-on-insulator devices such as silicon-on-sapphire devices.

Those skilled in the art will recognize that further variations are possible within the scope of the invention, which is defined in the appended claims.

What is claimed is:

1. A semiconductor device formed in a silicon-on-insulator (SOI) substrate including an insulating layer and a semiconductor layer disposed on the insulating layer, the semiconductor device including a gate electrode, a gate insulation film sandwiched between the gate electrode and the semiconductor layer, and a source region and a drain region of a first conductive type formed in the semiconductor layer on mutually opposite sides of the gate electrode, the source region and the drain region having a first carrier concentration, wherein the semiconductor layer comprises:

a channel region of a second conductive type opposite to the first conductive type, the channel region being disposed below the gate electrode, the channel region being doped to have a second carrier concentration; and a low-carrier-concentration layer of the second conductive type disposed partly below the channel region, making contact with the source region and the channel region, the low-carrier-concentration layer being doped to have a third carrier concentration lower than the second carrier concentration.

2. The semiconductor device of claim 1, wherein the low-carrier-concentration layer is an unchanged part of the semiconductor layer remaining after formation of the channel region and the source region.

3. The semiconductor device of claim 1, wherein the low-carrier-concentration layer is a doubly doped layer doped with an impurity of the first conductive type and another impurity of the second conductive type.

4. The semiconductor device of claim 1, wherein the third carrier concentration is greater than zero but less than $1 \times 10^{17}/\text{cm}^3$.

5. The semiconductor device of claim 4, wherein the third carrier concentration is substantially $1 \times 10^{14}/\text{cm}^3$.

6. The semiconductor device of claim 4, wherein the second carrier concentration is at least $1 \times 10^{17}/\text{cm}^3$.

7. The semiconductor device of claim 4, wherein the second carrier concentration is not more than $5 \times 10^{18}/\text{cm}^3$.

8. The semiconductor device of claim 1, wherein the low-carrier-concentration layer and the source region are electrically separated by an energy barrier not exceeding 0.9 electron volts.

9. The semiconductor device of claim 8, wherein the low-carrier-concentration layer and the source region are electrically separated by an energy barrier of at least 0.6 electron volts.

10. The semiconductor device of claim 1, further comprising a pocket layer of the second conductive type disposed in contact with the low-carrier-concentration layer, the drain region, and the channel region, the pocket layer being doped to have a fourth carrier concentration higher than the second carrier concentration.

11. The semiconductor device of claim 10, wherein the fourth carrier concentration is at least $1\times10^{18}/cm^3$.

12. The semiconductor device of claim 1, wherein the source region includes an extension with a fifth carrier concentration lower than the first carrier concentration, the semiconductor device including a first pn junction between the source region and the channel region, the pn junction being formed at an interface between the channel region and the extension of the source region.

13. The semiconductor device of claim 12, wherein the low-carrier-concentration layer occupies space between the channel region and the insulating layer and space between the extension of the source region and the insulating layer.

14. The semiconductor device of claim 1, wherein the silicon-on-insulator substrate includes a silicon supporting layer, the insulating layer being disposed the silicon supporting layer and the semiconductor layer.

15. The semiconductor device of claim 14, wherein the insulating layer is a buried oxide layer.

16. The semiconductor device of claim 1, wherein the source region extends from a surface of the semiconductor layer to the insulating layer.

17. The semiconductor device of claim 1, wherein the source region includes a metal silicide layer.

* * * * *